(12) United States Patent
Mozak et al.

(10) Patent No.: US 10,573,272 B2
(45) Date of Patent: Feb. 25, 2020

(54) DEVICE, METHOD AND SYSTEM FOR PROVIDING A DELAYED CLOCK SIGNAL TO A CIRCUIT FOR LATCHING DATA

(71) Applicant: Intel Corporation, Santa Clara, CA (US)

(72) Inventors: Christopher Mozak, Portland, OR (US); Senthil Kumar Sampath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/022,357

(22) Filed: Jun. 28, 2018

(65) Prior Publication Data

US 2020/0005729 A1    Jan. 2, 2020

(51) Int. Cl.
| | |
|---|---|
| *H03L 7/06* | (2006.01) |
| *G09G 5/00* | (2006.01) |
| *H03K 5/135* | (2006.01) |
| *H03K 5/14* | (2014.01) |
| *H03L 1/00* | (2006.01) |
| *H03L 1/02* | (2006.01) |
| *H03L 7/081* | (2006.01) |
| *H03K 5/00* | (2006.01) |

(52) U.S. Cl.
CPC .............. *G09G 5/008* (2013.01); *H03K 5/135* (2013.01); *H03K 5/14* (2013.01); *H03L 1/00* (2013.01); *H03L 1/02* (2013.01); *H03L 7/0812* (2013.01); *G09G 2310/08* (2013.01); *G09G 2320/041* (2013.01); *H03K 2005/00019* (2013.01)

(58) Field of Classification Search
CPC ... H03L 7/0814; H03L 7/0812; H03L 7/0805; H03L 7/087; G11C 7/222
USPC .................................................. 327/158, 161
See application file for complete search history.

(56) References Cited

U.S. PATENT DOCUMENTS

| | | | |
|---|---|---|---|
| 7,571,340 | B2 | 8/2009 | Jiang |
| 8,248,124 | B2 | 8/2012 | Mosalikanti et al. |
| 9,218,575 | B2 | 12/2015 | Mozak et al. |
| 9,628,092 | B2 | 4/2017 | Francom et al. |
| 2007/0069779 | A1* | 3/2007 | Kim ...................... H03L 7/0805 327/158 |

(Continued)

OTHER PUBLICATIONS

International Search Report and Written Opinion from PCT/US2019/034208 dated Sep. 20, 2019, 15 pgs.

*Primary Examiner* — Anh Q Tra
(74) *Attorney, Agent, or Firm* — Green, Howard & Mughal LLP

(57) ABSTRACT

Techniques and mechanisms for determining a delay to be applied to a clock signal for synchronizing data communication. In an embodiment, a delay is applied to a first clock signal to generate a second clock signal, which is then communicated to a latch circuit via a clock signal distribution path. The delay is determined based on an evaluation of a first time needed for signal communication via a model of the clock signal distribution path. Such determining is further based on an evaluation of a second time for one cycle of a cyclical signal, where said cycle correspond to that of the first clock signal. In another embodiment, multiple different delays are applied each to a different respective clock signal, where each of said delays is based on both the evaluation of the first time and the evaluation of the second time.

18 Claims, 8 Drawing Sheets

(56) References Cited

U.S. PATENT DOCUMENTS

| | | |
|---|---|---|
| 2010/0253404 A1* | 10/2010 | Ma .......................... H03L 7/07 |
| | | 327/158 |
| 2012/0087452 A1 | 4/2012 | Zerbe et al. |
| 2013/0162308 A1 | 6/2013 | Sakashita et al. |
| 2015/0002196 A1* | 1/2015 | Takahashi ............ H03L 7/1972 |
| | | 327/158 |
| 2015/0236700 A1 | 8/2015 | Townley et al. |
| 2016/0013796 A1* | 1/2016 | Choi .................... H03L 7/0802 |
| | | 327/158 |
| 2016/0226474 A1 | 8/2016 | Roytman et al. |
| 2017/0076777 A1 | 3/2017 | Iijima et al. |
| 2017/0338825 A1 | 11/2017 | Lee et al. |

\* cited by examiner

DEVICE, METHOD AND SYSTEM FOR PROVIDING A DELAYED CLOCK SIGNAL TO A CIRCUIT FOR LATCHING DATA

BACKGROUND

1. Technical Field

Embodiments of the invention relate generally to integrated circuit structures and more particularly, but not exclusively, to circuitry operable to determine a delay to be applied to a clock signal.

2. Background Art

Communication between components on a host platform is necessary for operation of an electronic device. However, various conditions affect the timing of high-speed communication between components, such as temperature change and voltage variation. In general, the communication among different components can be referred to as I/O (input/output), and is frequently governed by standards (e.g., between components of a memory subsystem). The I/O standards can relate to performance characteristics for I/O power, I/O latency, and I/O frequency. The standards or nominal values of I/O performance settings are set to values that can be achieved across different systems for compatibility and interoperability. Typically, there are tradeoffs between power and latency. Thus, using tight timing parameters can reduce power, but causes the I/O latency to be more negatively affected by temperature, voltage, and process variation.

In existing forwarded clock architectures using an unmatched receiver, delay line calibration is performed to offset a clock signal so that a clock signal edge is centered with respect to a data signal. Conventional delay line calibration techniques use one time training or a continuous clock and data recovery (CDR) loop to provide a particular phase relationship between the forwarded clock and a corresponding data signal to be sampled. These calibration techniques need to be done individually in every one of the received clock paths of a system, which in turn requires additional area and power overhead per forwarded clock group. As successive generations of integrated circuit technologies continue to support faster operational frequencies, there is expected to be an increasing premium placed on incremental improvements to system clocking solutions.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
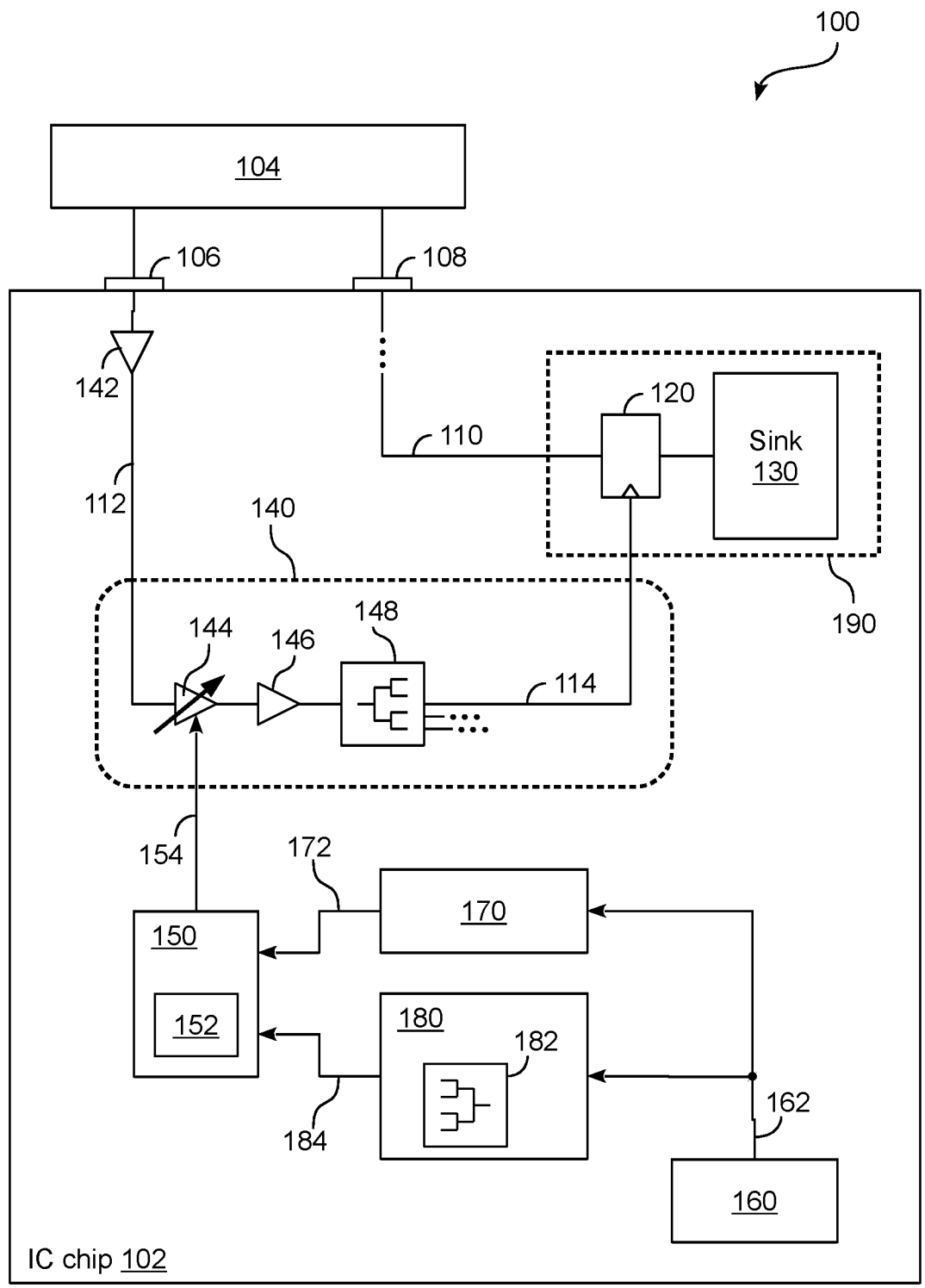
FIG. 1 illustrates a high-level functional block diagram illustrating elements of a system to provide a clock signal according to an embodiment.

Embodiments discussed herein variously provide techniques and mechanisms for determining a delay to be applied to a clock signal for synchronizing the latching of data received in a data signal. The clock signal is delayed by first circuitry, and then communicated from the first circuitry to a latch circuit via a clock signal distribution path. The delay is determined based on the evaluation of a first time duration which is needed for signal communication via a model of the clock signal distribution path (where the first time duration corresponds to that needed for communication via the clock signal distribution path itself). Determination of the delay is further based on the evaluation of a second time duration for one cycle of a cyclical signal (wherein the second time duration is the same as that for one cycle of the clock signal). A total delay to be applied to the clock signal may vary linearly (or alternatively, non-linearly) with one or both of one of the first time duration or the second time duration. Such a delay may be proportional to a sum which is based on the first time duration and the second time duration. In some embodiments, the delay is determined at least in part based on a conditional evaluation of whether the first time duration or the second time duration satisfies a predefined test condition—e.g., where the delay is based on a comparison of a time duration with a threshold amount of time.

In an embodiment, multiple delays are variously applied each to a different respective clock signal, where the multiple delays are each determined based on both the first time duration and the second time duration. As a result, some embodiments enable at least one delay component to be determined, based on a model of a clock distribution path, for use in multiple different delay calibration processes. As compared to existing clock delay calibration techniques, such embodiments variously facilitate reduced area, power and/or other resource requirements.

Certain features of various embodiments are described herein with respect to the communication of a delayed clock signal via a clock signal distribution path, wherein a model of the clock signal distribution path is used as one basis for determining the delay which is to be applied to said clock signal. As used herein, "clock signal distribution path" (or, for brevity, "clock distribution path") refers to circuit structures which provide a conductive path for the communication of a clock signal. A clock distribution path may be one branch, leg or other path of a larger clock distribution network which further comprises multiple such paths arranged—for example—in a mesh, tree or other branching topology. A given clock distribution path may include one or more interconnect structures and, in some embodiments, one or more buffers arranged in series with said one or more interconnect structures. Additionally or alternatively, such a clock distribution path may comprise one or more programmable delay elements that, for example, are variously configurable (e.g., independent of each other) to coordinate a relative timing between respective rise/fall transitions of a delayed clock signal and another signal. A model of other circuitry (in addition to a model of a clock distribution path) may also be used to determine the delay which is to be applied to said clock signal. Examples of such other circuitry include an input/output (IO) transmitter circuit, an IO receiver circuit, a duty cycle adjustment circuit and/or any of various other circuits which may be used to communicate a clock signal that is delayed using techniques described herein.

In the context of modeling a clock signal path, "model" refers herein to circuit structures which emulate those of an associated clock distribution path—i.e., where the emulation is at least with respect to a time duration needed to perform a communication through said circuit structures. The circuit structures of the model may include interconnect structures and, in some embodiments, one or more buffers arranged in series with said one or more interconnect structures. In such an embodiment, an overall length of the conductive path of a given model may be substantially equal to that of the associated clock distribution path (e.g., to within 10% and, in some embodiments, to within 1%). Alternatively or in addition, a total number of any buffers of the model may be substantially equal to that of any buffers of the associated clock distribution path (e.g., to within 10%).

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including integrated circuitry which uses a clock to latch data.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

It is pointed out that those elements of the figures having the same reference numbers (or names) as the elements of any other figure can operate or function in any manner similar to that described, but are not limited to such.

FIG. 1 shows features of a system 100 according to an embodiment to time the latching of data based on a delayed clock signal. System 100 is one example of an embodiment wherein integrated circuitry is operable to apply a time delay to a first clock signal to generate a second clock signal, wherein the delay is determined based on both a cycle corresponding to that of the first clock signal, and a model of a clock distribution path which is used to communicate the second clock signal.

As shown in FIG. 1, system 100 comprises an integrated circuit (IC) chip 102 and a source 104 coupled thereto. Source 104 represents any of a variety of circuit devices to communicate a data signal and a clock signal with IC chip 102. For example, source 104 may be another IC chip of a packaged device which also includes IC chip 102. Alternatively, a packaged device comprising IC chip 102 may be coupled to another packaged device which includes source 104. In the example embodiment shown, a hardware interface of IC chip 102 comprises conductive contacts 106, 108—e.g., microbumps—to communicate (respectively) a data signal 110 and a clock signal 112 with source 104. In some embodiments, system 100 omits source 104 and, for example, comprises merely IC chip 102.

Latch circuitry 120 of IC chip 102 may be coupled to receive data signal 110. Data of data signal 110 to be provided via latch circuitry 120 to some circuit resource of IC chip 102 such as the illustrative data sink 130 shown. Data sink 130 may comprise a bus, a processor, a memory, a controller hub and/or any of various other circuit components which are operable to store, communicate or otherwise process some or all data of data signal 110. Some embodiments are not limited to a particular functionality that data sink 130 is to provide with such data.

To facilitate operation of at least some synchronous domain 190 of IC chip 102, latch circuitry 120 may time a latching of said data to data sink 130. A clock signal 114 provided to latch circuitry 120 controls such latching, wherein clock signal 114 is generated based on clock signal 112. For example, IC chip 102 may further comprise circuitry (such as the illustrative programmable delay line 144 shown) which is coupled to receive clock signal 112 from source 104—e.g., wherein clock signal 112 is communicated via receiver circuitry such as the illustrative amplifier 142 shown.

Generation of clock signal 114 based on clock signal 112 may include delay line 144 applying a delay to clock signal 112. The delay may be applied to account at least for a period of time which is needed for signal communication via one or more interconnects and/or other circuit structures which are coupled between delay line 144 and latch circuitry 120. For example, latch circuitry 120 may receive clock signal 114 via a signal path which comprises a clock signal distribution path 148. Clock signal distribution path 148 may be one path of a clock signal distribution network— e.g., wherein multiple paths of the network are each to communicate a respective version of clock signal 114 to a corresponding latch circuit. In such an embodiment, delay line 144 is programmed or otherwise controlled to provide a clock signal delay which accounts at least for a time needed for communication along clock signal distribution path 148. The delay applied to clock signal 112 by delay line 144 may be further based on a period of time for a particular scalar multiple of one cycle of clock signal 112. Such a scalar multiple may be positive or negative. The scalar multiple may be between zero (0) and one (1), for example. In some embodiments, the scalar multiple is one of one-fourth, one-half, or three-fourths (e.g., wherein the scalar multiple is one of one-fourth, or three-fourths). In other embodiments, the scalar multiple is more than one (1)—e.g., wherein the scalar multiple corresponds to an integer multiple of one-quarter of a cycle.

In the example embodiment shown, application of a delay to clock signal 112 is based on a control signal 154 which control circuitry 150 of IC chip 102 provides to delay line 144. Generation of control signal 154 by control circuitry 150 is based on an evaluation of a communication delay by a circuit which models clock signal distribution path 148. For example, IC chip 102 may further comprise an evaluator circuit 170 and an evaluator circuit 180 each coupled to control circuitry 150, and each to receive a cyclical signal (such as the illustrative signal 162 shown) which has a frequency and a phase corresponding to those of clock signal 112. In the example embodiment shown, cyclical signal 162 is provided by circuitry 160 which includes a phase locked loop circuit. The phase locked loop circuit may be coupled receive a system clock signal (not shown) which source 104 also uses to generate clock signal 112. In another embodiment, cyclical signal 162 is clock signal 112 itself—e.g., wherein IC chip 102 omits circuitry 160.

Based on a cycle of cyclical signal 162 (which corresponds to a cycle of clock signal 112), evaluator circuit 170 generates a signal 172 comprising an indication of a delay which corresponds to—e.g., which is equal to a duration of—the cycle. In some embodiments, evaluator circuit 170 comprises a delay-locked loop (DLL) which detects a time duration for such a cycle. Evaluator circuit 180 provides to control circuitry 150 a signal 184 which is generated based on cyclical signal 162. Evaluator circuit 180 detects a time duration which is needed to communicate cyclical signal 162 through a path which includes a model 182 of clock signal distribution path 148. The path may further model other circuitry which is also used to communicate the delayed clock signal. In such an embodiment, a time needed for signal communication via the path corresponds to a time needed for signal communication via a combination of the other circuitry and the clock signal distribution path coupled thereto. Based on such detecting of the time duration which is needed to communicate cyclical signal 162, evaluator circuit 180 communicates via signal 184 a second indication of another delay to account for said time duration. Accordingly, signals 172, 184 may indicate to control circuitry 150, respectively, a delay based on a cycle which corresponds to that of clock signal 112, and another delay based on a communication through a path which corresponds to clock signal distribution path 148.

Control circuitry 150 may include or otherwise have access to some redefined state of IC chip 102 (such as the illustrative reference information 152 shown) which facilitates generation of control signal 154 based on signals 172, 184. IC chip 102 may be initialized, preprogrammed or otherwise preconfigured—e.g., by a manufacturer or other agent—with reference information 152 which specifies or otherwise indicates a particular scalar multiple of one cycle by which clock signal 112 is to be delayed to facilitate an effective latching by latch circuitry 120. Delaying clock signal 112 by at least a fraction of a cycle may, for example, mitigate the risk of data signal 110 being sampled at or near a time between two successive data bytes. Such a fraction may, for example, be one of one fourth, one half, or three fourths—e.g., wherein the fraction is one of one fourth, or three fourths.

In one illustrative scenario, signal 172 includes or otherwise indicates an identifier CodeCycle of a time duration for a cycle of clock signal 112—e.g., wherein signal 184 includes or otherwise indicates an identifier CodeFwdClk of a time duration for communication via the path which includes model 182. In such an embodiment, control circuitry 150 may perform a lookup or other processing to determine, based on CodeCycle and CodeFwdClk, an identifier DelayCode of a total delay to be applied to clock signal 112 by delay line 144. For example, DelayCode may vary with a sum which is based on CodeCycle and CodeFwdClk—e.g., according to the following:

$$\text{DelayCode} \propto \text{CodeFwdClk} + \beta_0[\text{CodeCycle}], \quad (1)$$

where $\beta_0$ is a defined multiplier factor for a particular scalar multiple of a clock cycle, a particular multiple clock cycles, or the like. The factor $\beta_0$ may, for example, include or otherwise be based on an N-bit value PICode[N−1:0]—e.g., according to the following:

$$\beta_0 = \{\text{PICode}[N-1:0]\}/\{2^N\}. \quad (2)$$

For example, PICode[N−1:0] being equal to $2^N$ may indicate a delay which corresponds to one whole clock cycle. In some embodiments, reference information 152 indicates one or more additional components of the delay to be indicated in control signal 154. For example, one or more other circuit components of circuitry 140 (other than clock signal distribution path 148) may each be a respective source of additional clock signal delay which is to be further accounted for with delay line 144. These one or more additional delay components may also be included in a function to determine the identifier DelayCode.

DelayCode may be proportional to any of various more complex functions of CodeFwdClk and CodeCycle, in other embodiments. By way of illustration and not limitation, factor $\beta_0$ may itself vary based on an evaluation of one or both of CodeFwdClk and DelayCode. In one example embodiment, factor $\beta_0$ may be increased (or decreased) by an integer amount based on a comparison of one of CodeFwdClk or DelayCode to a corresponding predefined threshold value. Such incremental adjustment to factor $\beta_0$ may mitigate clock signal jitter or otherwise promote robust operation.

Based on the respective delay indicators of signals 172, 184, control circuitry 150 may communicate via control signal 154 (e.g., with the identifier DelayCode) a delay to be applied to clock signal 112. The resulting delayed clock signal 114 may be communicated from delay line 144 to latch circuitry 120 via a path which includes clock signal distribution path 148—e.g., wherein the path further comprises buffer 146. Responsive to clock signal 114, data of data signal 110 may be latched through latch circuitry 120 to the data sink 130 coupled thereto. At various times during operation of system 100, control circuitry 150 may intermittently update control signal 154 based on a change to state of IC chip 102. For example, one or both of signals 172, 184 may change over time with a changing thermal state of IC chip 102. Control circuitry 150 may monitor signals 172, 184 constantly or—alternatively—on some intermittent basis. In some embodiments, one or more sensors (not shown) which are included in or coupled to IC chip 102 provide to control circuitry 150 sensor information indicating a temperature of system 100. In such an embodiment, control circuitry 150 may sample signals 172, 184 in response to detection of a temperature change at or near IC chip 102, and update control signal 154 based on such sampling.

Figure 2:
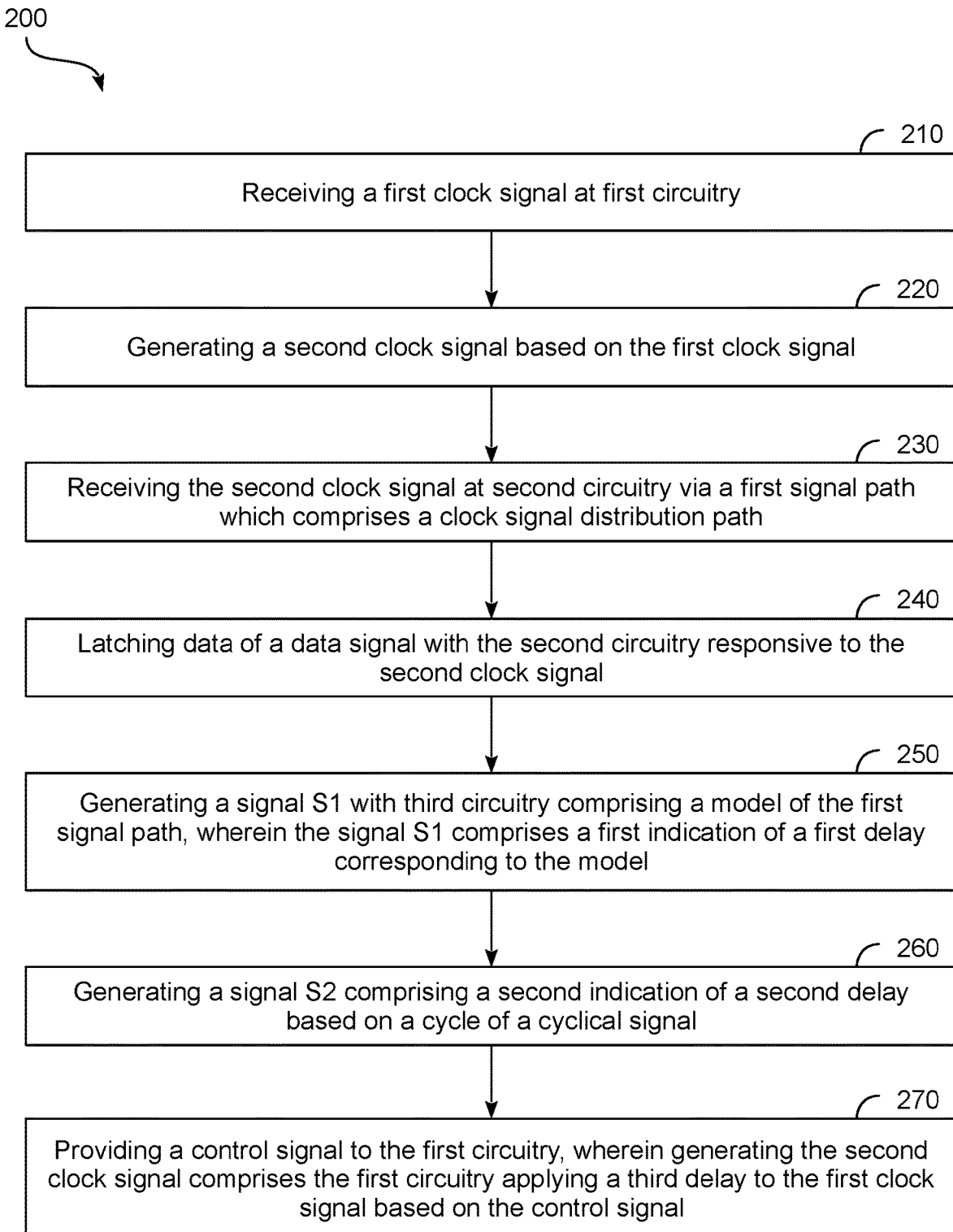
FIG. 2 illustrates a flow diagram illustrating elements of a method to provide a clock signal with integrated circuitry according to an embodiment.

FIG. 2 shows features of a method 200 to provide a clock signal for latching data according to an embodiment. Method 200 is one example of an embodiment wherein a time delay is applied to a clock signal, wherein the delay is determined using both a cycle corresponding to that of the first clock signal, and a model of a clock distribution path which is used to communicate the resulting delayed clock signal. Method 200 may be performed with IC chip 102, for example.

As shown in FIG. 2, method 200 includes (at 210) receiving a first clock signal at first circuitry of an IC chip. The first circuitry comprises a programmable delay line or other such circuitry which is operable, based on a control signal, to apply a delay to the first clock signal. For example, the receiving at 210 may include clock signal 112 being received at programmable delay line 144. Method 200 further comprises (at 220) generating a second clock signal based on the first clock signal. The generating at 220 may include delay line 144 applying a delay to clock signal 112—e.g., where said delay is based on multiple delay components which are identified with evaluation circuitry of the IC chip.

In an embodiment, method 200 further comprises (at 230) receiving the second clock signal at second circuitry via a first signal path which comprises a clock signal distribution path. For example, the second clock signal, the second circuitry and the clock signal distribution path may correspond functionally to clock signal 114, latch circuitry 120 and distribution path 148 (respectively). In such an embodiment, the first signal path may include one or more other components of circuitry 140 (i.e., in addition to distribution path 148). The second clock signal may be further communicated variously to one or more other latch circuits of the IC chip—e.g., where each such communication of the second clock signal is via a different respective clock signal distribution path of a clock signal distribution network. Method 200 may further comprise (at 240) latching data of a data signal with the second circuitry responsive to the second clock signal. For example, the latching at 240 may communicate some of data signal 110 to sink 130 (such as a processor core which is included in or coupled to the second circuitry).

Processes of method 200 may communicate information for determining a clock delay which is applied to generate the second clock signal at 220. For example, method 200 may further comprise (at 250) generating a signal S1 with third circuitry comprising a model of the first signal path—e.g., wherein signal S1 and the third circuitry correspond functionally to signal 184 and evaluator circuit 180 (respectively). The signal S1 may include a first indication of a first delay which corresponds to the model. For example, the first delay (e.g., CodeFwdClk) may be equal to or otherwise based on a time needed to communicate a signal via the model.

Method 200 may further comprise (at 260) generating a signal S2 comprising a second indication of a second delay based on a cycle of a cyclical signal. The generating of signal S2 at 260 may be performed with delay-locked loop circuitry such as that of evaluator circuit 170—e.g., wherein CodeCycle represents the second delay. Method 200 further comprises (at 270) providing a control signal to the first circuitry, wherein generating the second clock signal at 220 comprises the first circuitry applying a third delay to the first clock signal based on the control signal. The control signal may be generated with third circuitry of the IC chip based on signals S1, S2—e.g., wherein the control signal and the third circuitry are control signal 154 and control circuitry 150 (respectively). For example, the third delay may be proportional to a sum which is determined based on a first value and a second value, wherein the first value represents the first delay indicated by signal S1, and wherein the second value represents a time for a particular scalar multiple of a cycle which is indicated by signal S2. The scalar multiple may be calculated based on one or more factors including, for example, the first delay (indicated by signal S1), an allowed limit or range of a programmable delay line, feedback signaling from clock monitoring/training logic, etc. In various embodiments, the scalar multiple is positive or negative. In some embodiments, such a scalar multiple is one of one fourth, one half, or three fourths. (e.g., one of one fourth or three fourths).

In some embodiments, method 200 further comprises intermittently updating the control signal (and thus updating the delay to be applied to the first clock signal) based on a change to one of the signal S1 or the signal S2. Such intermittent updating may be performed in response to the detection of a temperature transition, a voltage transition or other changed state in a packaged device which includes the IC chip.

Figure 3:
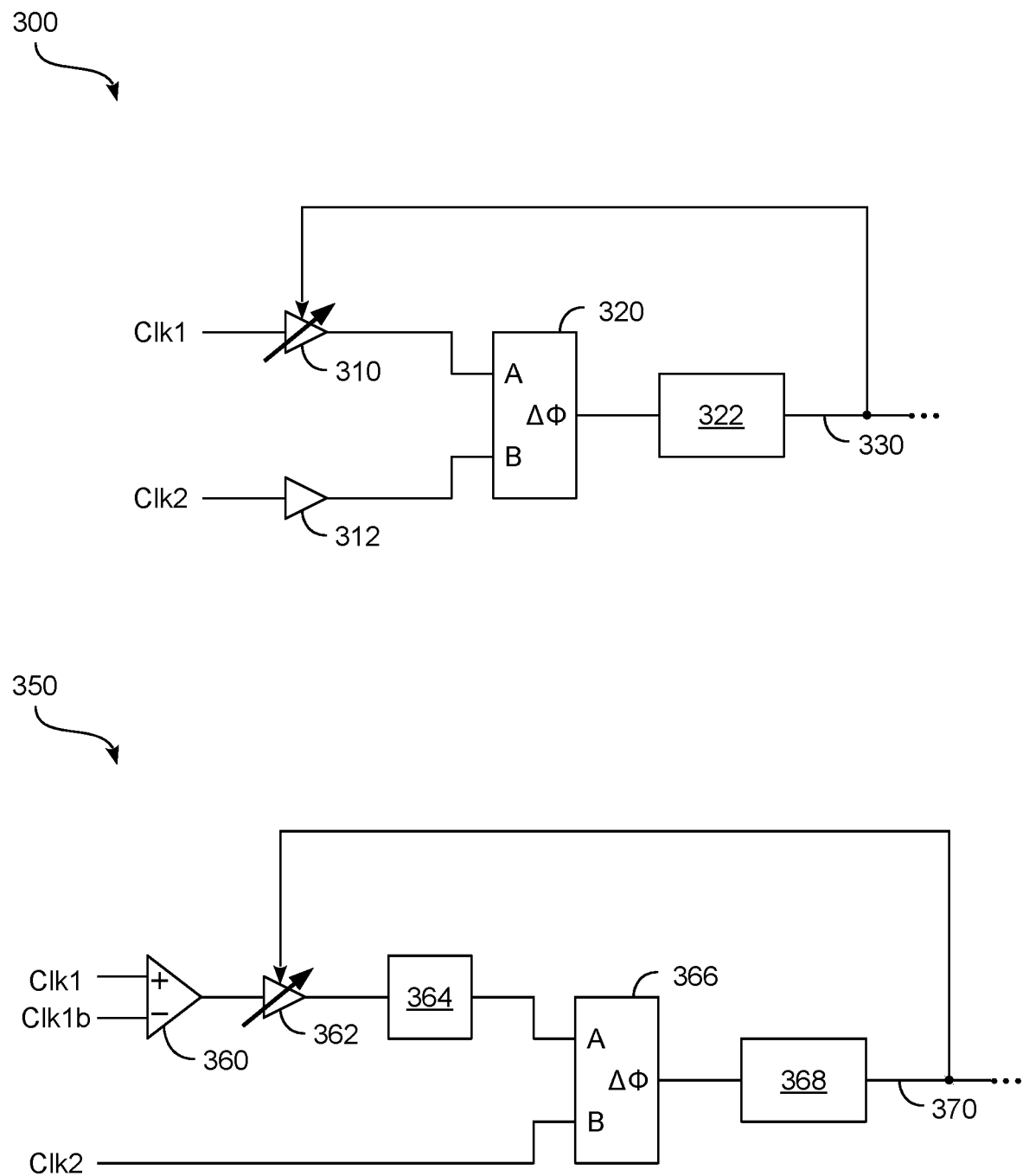
FIG. 3 illustrates high-level functional block diagrams of respective circuit components to facilitate the delay of a clock signal according to a corresponding embodiment.

FIG. 3 shows features of an evaluator circuit 300 to participate in the generation of a delayed clock signal according to an embodiment. Evaluator circuit 300 is one example of delay locked loop circuit which provides signaling to indicate a time duration for one cycle of a clock signal (such as clock signal 112). For example, functionality of 300 may correspond to that of evaluator circuit 170 and/or may provide an output such as the signal S2 which is generated at 260 of method 200.

As shown in FIG. 3, evaluator circuit 300 includes a programmable delay line 310 and an amplifier 312 to receive respective cyclical signals Clk1, Clk2—e.g., wherein Clk1 includes (or is otherwise based on) a cyclical signal such as signal 162, and wherein Clk2 is a version of the cyclical signal which, as compared to Clk1, has been delayed by some integer number of cycles. For example, evaluator circuit 300 may include or couple to circuitry (not shown) which generates Clk1 and Clk2 based on signal 162 or other such cyclical signal.

A phase detector 320 of evaluator circuit 300 may be coupled to receive respective outputs of delay line 310 and an amplifier 312—e.g., wherein delay line 310 provides a version of Clk1 which has been delayed based on a feedback version of a signal 330. Phase detector 320 provides an output which indicates a difference between the respective phases of Clk2 and the delayed version of Clk1. Based on such an output from phase detector 320, an encoder 322 (e.g., a finite state machine or other suitable circuitry) of evaluator circuit 300 may perform a lookup or other process to an identify an amount of a delay which is to be communicated to delay line 310 via the feedback of signal 330. For example, encoder 322 may identify a delay amount which will reduce a current difference between the respective phases of Clk1 and Clk2. Over time, evaluator circuit 300 may "lock" onto a delay amount which delay line 310 is to apply for zero (or nearly zero) phase difference between Clk1 and Clk2. When evaluator circuit 300 is so locked, signal 330 may indicate a time duration for a single cycle of Clk1 (and, correspondingly, a time duration for a single cycle of a clock signal such as clock signal 112). This value may be communicated by signal 330 to other circuitry (not shown) which is coupled to evaluator circuit 300, where said other circuitry—e.g., to control circuitry 150—is to determine a delay to be applied to a clock signal.

FIG. 3 further shows features of an evaluator circuit 350 which is also to participate in the generation of a delayed clock signal according to an embodiment. Evaluator circuit 350 is one example of circuitry which includes a model of a clock signal distribution path, where the circuitry provides signaling to indicate a time needed for communication via said clock signal distribution path. For example, functionality of 350 may correspond to that of evaluator circuit 180 and/or may provide an output such as the signal S1 which is generated at 250 of method 200.

As shown in FIG. 3, evaluator circuit 350 includes a differential amplifier 360 to receive cyclical signals Clk1, Clk1b—e.g., wherein Clk1 is the same Clk1 provided to evaluator circuit 350 and where Clk1b is a logically inverted version of Clk1. Differential amplifier 360 provides to a programmable delay line 362 of evaluator circuit 350 a signal representing a difference between Clk1 and Clk1b. For example, evaluator circuit 350 may include or couple to circuitry (not shown) which generates Clk1 and Clk1b based on the same cyclical signal.

Delay line 362 applies to the output signal from differential amplifier 360 a delay which is based on the feedback of a signal 370. This delayed output signal is then provided by delay line 362 to a model 364 of a clock signal distribution path (not shown) such as clock signal distribution path 148. After communication through model 364, the delayed output from delay line 362 is provided to a phase detector 366 of evaluator circuit 350. Phase detector 366 may be further coupled to receive respective a signal Clk2 which (for example) is the same Clk2 provided to evaluator circuit 350. Phase detector 366 provides an output which indicates a difference between the respective phases of Clk2 and the delayed output signal received via model 364. Based on such an output from phase detector 366, an encoder 368 (e.g., a finite state machine or other suitable circuitry) of evaluator circuit 350 may perform processing to identify an amount of a delay which is to be communicated to delay line 362 via a feedback of signal 370. For example, encoder 368 may identify a delay amount which will reduce a current phase difference indicated by phase detector 366. Over time, evaluator circuit 350 locks onto a delay amount which delay line 362 is to apply so that phase detector 366 indicates a zero (or nearly zero) phase difference. When evaluator circuit 350 is so locked, signal 370 indicates a time duration needed for signal communication through model 364 (and, similarly, a time duration needed for signal communication through a corresponding clock signal distribution path which model 364 represents). This value may be communicated by signal 370 for use by other circuitry (not shown)—e.g., by control circuitry 150—which is coupled to evaluator circuit 350.

Figure 4:
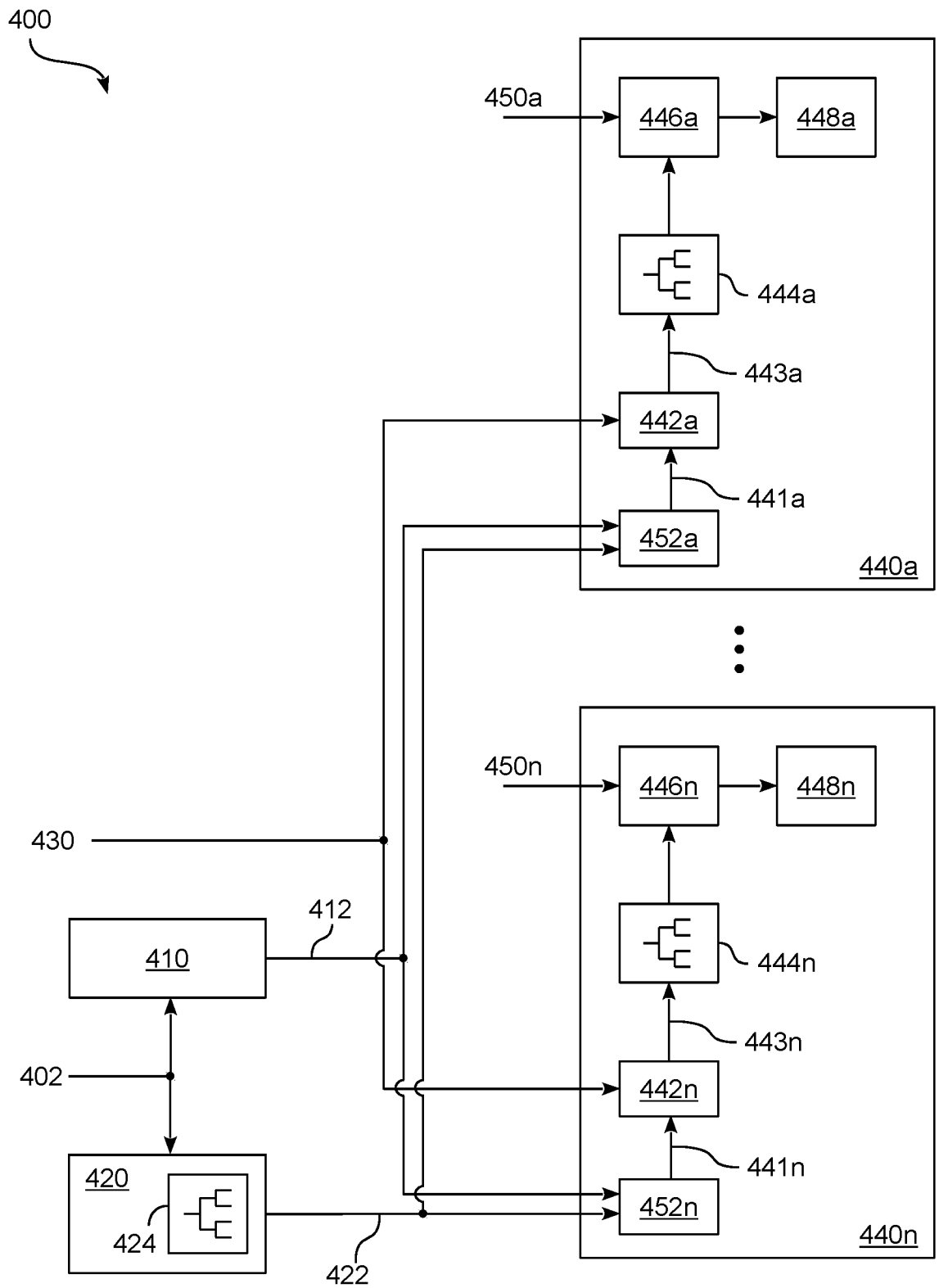
FIG. 4 illustrates a high-level functional block diagram illustrating elements of an integrated circuit to provide a delay of a clock signal according to an embodiment.

FIG. 4 shows features of integrated circuitry 400 to provide clocking for various data signals according to an embodiment. Integrated circuitry 400 is one example of an embodiment wherein integrated circuitry is operable to variously generate multiple clock signals each by applying a respective delay to a first clock signal, the respective delays each determined based on both a cycle corresponding to that of the first clock signal and a respective model of a clock distribution path. Integrated circuitry 400 may include some or all of the features of IC chip 102, for example. As shown in FIG. 4, integrated circuitry 400 may include circuit resources (such as the illustrative circuit resources 440a, . . . , 440n shown) which are each coupled to receive a clock signal 430, wherein the circuit resources 440a, . . . , 440n are to variously latch respective data based on clock signal 430.

In the example embodiment shown, circuit resource 440a includes a programmable delay line 442a and a latch circuit 446a which are coupled to receive (respectively) clock signal 430 and a data signal 450a. Responsive to a delayed clock signal 443a which is generated based on clock signal 430, latch circuit 446a may latch data of data signal 450a to a data sink 448a. For example, a control circuit 452a of circuit resource 440a may control delay line 442a with a control signal 441a which indicates a delay to be applied to clock signal 430. Latch circuit 446a, delay line 442a, and control circuit 452a may correspond functionally to latch circuitry 120, delay line 144, and control circuitry 150, respectively.

Generation of control signal 441a by control circuit 452a may be based on signals 412, 422 which, for example, are also used by circuit resource 440n. In the example embodiment shown, integrated circuitry 400 further comprises evaluator circuits 410, 420 each coupled to receive a cyclical signal 402—such as cyclical signal 162—which has the same frequency as that of clock signal 430 (and, in some embodiments, has the same phase as that of clock signal 430). Based on cyclical signal 402, evaluator circuit 410 may indicate with signal 412 a time duration for one cycle of cyclical signal 402 (which corresponds to a time duration for one cycle of clock signal 430). In such an embodiment, evaluator circuit 420 may indicate with signal 422 a time duration needed for signal communication through a model 424 of a clock signal distribution path 444a by which clock signal 443a is communicated to latch circuit 446a. For example, evaluator circuit 410 and evaluator circuit 420 may correspond functionally to evaluator circuit 170 and evaluator circuit 170, respectively (or to evaluator circuit 300 and evaluator circuit 350, respectively).

In such an embodiment, circuit resource 440n may provide functionality (similar to that of circuit resource 440a) to latch data of another data signal based on a different delay being applied to clock signal 430. For example, circuit resource 440n may include a programmable delay line 442n, a latch circuit 446n, a clock signal distribution path 444a and a data sink 448n which (respectively) correspond functionally to delay line 442a, latch circuit 446a, clock signal distribution path 444a and data sink 448a. Latch circuit 446n is operable to receive a data signal 450n and to latch data thereof to data sink 448n, where said latching is responsive to a clock signal 443n which is received from delay line 442n via clock signal distribution path 444n. Delay line 442n may generate clock signal 443n by applying a delay to clock signal 430—e.g., wherein different respective delays are variously applied to clock signal 430 by delay lines 442a, 442n for generating respective clock signals 443a, 443n. A control signal 441n from control circuit 452n indicates to delay line 442n the respective delay which is to be applied to clock signal 430. Similar to control signal 441a, generation of control signal 441n by control circuit 452n may be based on signals 412, 422.

In some embodiments, signal 412 communicates an identifier CC of a time duration for a cycle of clock signal 402—e.g., wherein signal 422 communicates an identifier CFC of a time duration for communication via the path which includes model 424. The identifiers CC and CFC may correspond (respectively) to CodeCycle and CodeFwdClk, for example. In such an embodiment, control circuitry 452a may to determine, based on the identifier CC and the identifier CFC, an identifier DC_A of a total delay to be applied by delay line 442a to clock signal 430 for generating clock signal 443a. Similarly, control circuitry 452n may to determine, based on the identifier CC and the identifier CFC, an identifier DC_N of a total delay to be applied by delay line 442n to clock signal 430 for generating clock signal 443n. For example, the identifiers DC_A and DC_N may vary each with a respective sum which is based on the identifier CC and the identifier CFC—e.g., according to the following:

$$DC\_A \propto CFC + \beta_A[CC], \text{ and} \quad (3)$$

$$DC\_N \propto CFC + \beta_N[CC], \quad (4)$$

where $\beta_A$ and $\beta_N$ are different respective scalar multiples of a clock cycle corresponding to the identifier CC.

Figure 5:
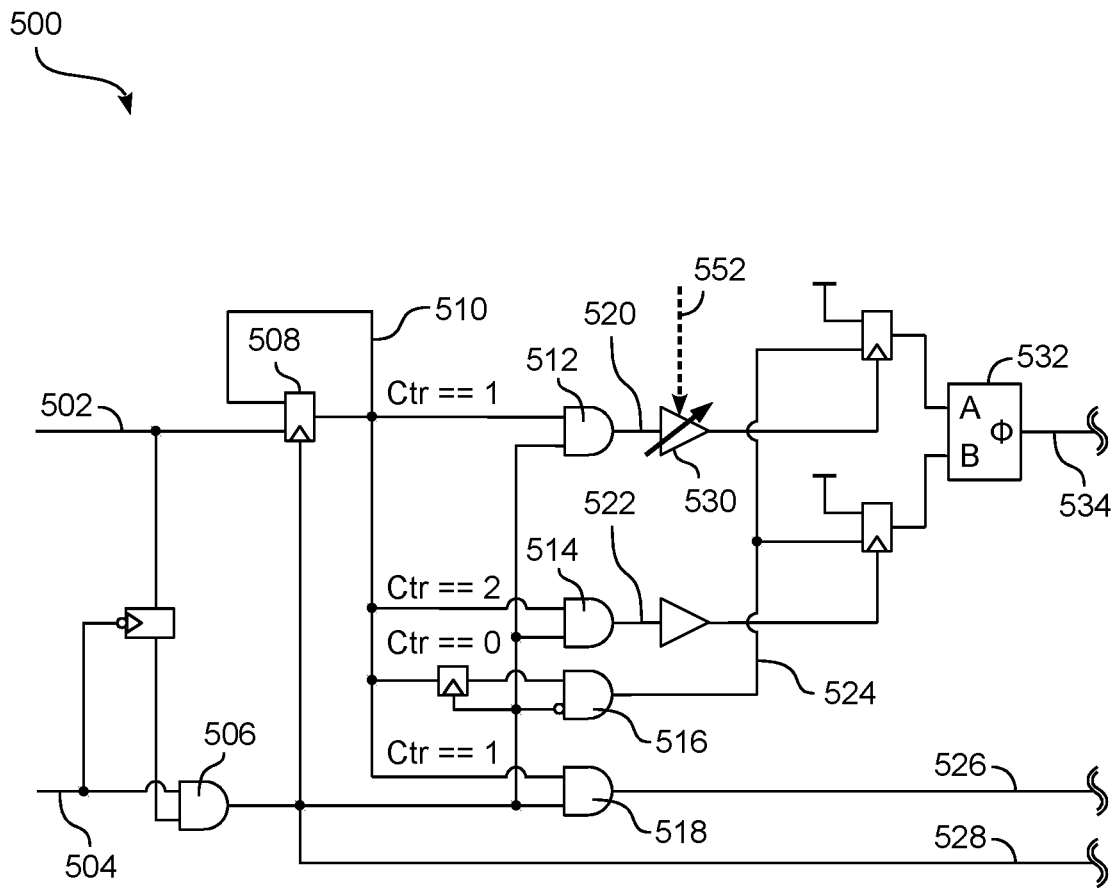
FIG. 5 illustrates a circuit diagram illustrating elements of a detector circuit to facilitate a delay to a clock signal according to an embodiment.
Figure 5:
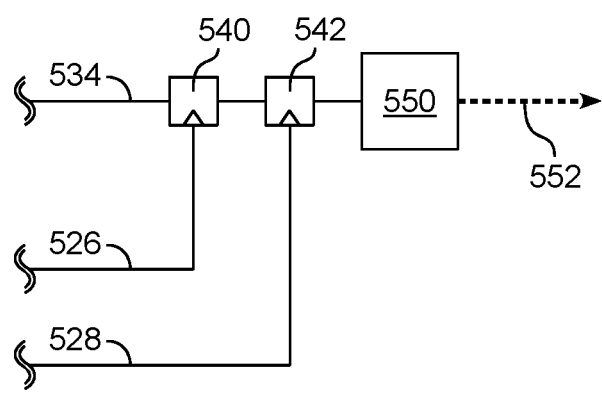

FIG. 5 shows features of an evaluator circuit 500 to participate in the generation of a delayed clock signal according to an embodiment. Evaluator circuit 500 is operable to provide delay locked loop circuit functionality such as that of evaluator circuit 170 and/or may provide an output such as the signal S2 which is generated at 260 of method 200.

As shown in FIG. 5, evaluator circuit 500 is coupled to receive a cyclical signal 504 (e.g., signal 162) and a control signal 502 which selectively enables a time delay detection functionality of evaluator circuit 500. With an AND gate 506 and a counter 508, a count signal 510 and a signal 528 are variously generated based on cyclical signal 504 and control signal 502. Count signal 510 may represent a counter value Ctr which repeatedly cycles through a sequence that counts between some minimum count value and some maximum count value. Based on signal 510 and signal 528, logic gates 512, 514 output respective signals 520, 522—e.g., wherein signal 520 is set to logic high based on Ctr being equal to one ("1") and signal 522 is set to high based on Ctr being equal to two ("2"). In such an embodiment, other logic gates 516, 518 may also output respective signals 524, 526 based on signal 510 and signal 528.

A programmable delay line 530 and a phase detector 532 may operate—based on signals 520, 522 and 524—to detect a time difference between respective logic state transitions by signals 520, 522. Such a time difference may correspond to a time for an integer number of cycles of cyclical signal 504 (where the integer is equal to or greater than 1). For example, delay line 530 may apply a delay to signal 520, where the delay is based on a feedback of a signal 552 which is also output from evaluator circuit 500. Signal 522 and the delayed version of signal 520 each control a respective latching of signal 524 to a corresponding input of phase detector 532. A signal 534 output by phase detector 532 indicates a difference between the latching which is based on signal 522 and the other latching which is based on the delayed version of signal 520. In such an embodiment, signal 534 is communicated to an encoder 550—e.g., where such communication is via latch circuits 540, 542. Signals 526, 528 may variously control latch circuits 540, 542 to mitigate a risk of the delay line locking an incorrect harmonic of a target delay.

Based on signal 534, encoder 550 may perform operations which identify an amount of a delay which is to be communicated to delay line 530 via the feedback of signal 552. For example, encoder 550 may identify a delay amount which will reduce a current time difference between the respective state transitions of signals 520, 522. Over time, evaluator circuit 500 may lock onto a delay amount which delay line 530 is to apply for zero (or nearly zero) difference between signals 520, 522. When evaluator circuit 500 is so locked, signal 552 may indicate a time duration for a single cycle of cyclical signal 504 (and, correspondingly, a time duration for a single cycle of a clock signal such as clock signal 112). This value may be communicated by signal 552 to other circuitry (not shown) which is coupled to evaluator circuit 500, where said other circuitry—e.g., control circuitry 150—is to determine a delay to be applied to a clock signal.

Figure 6:
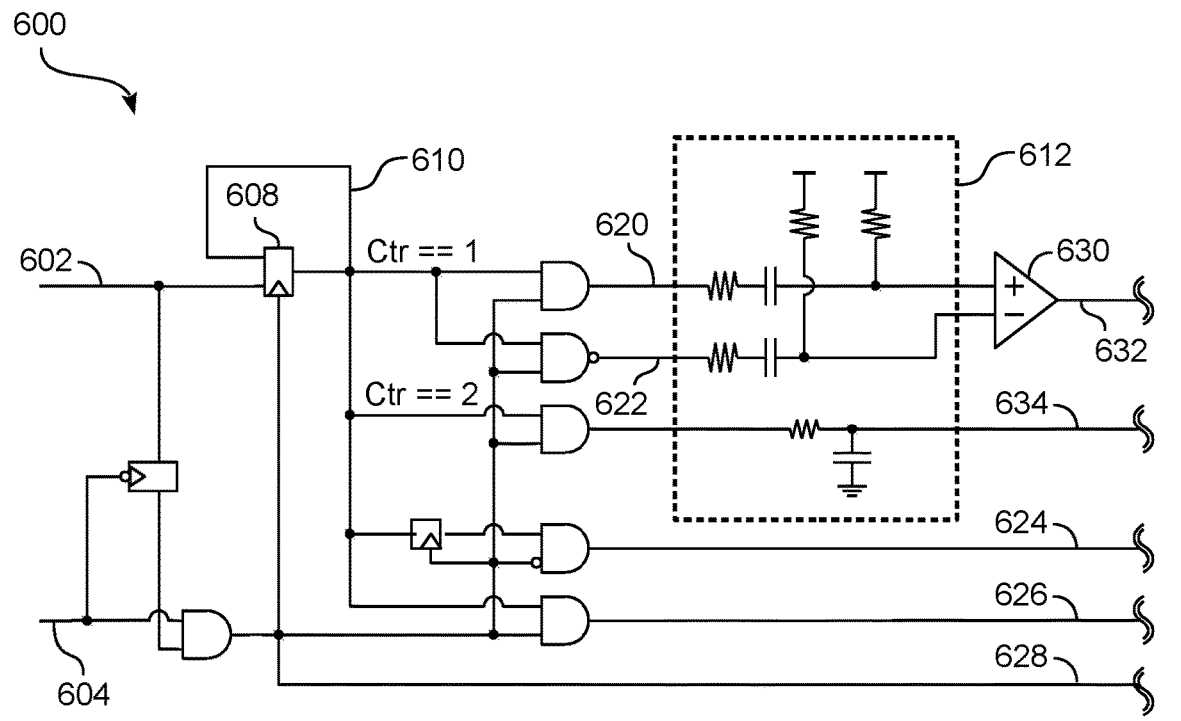
FIG. 6 illustrates a circuit diagram illustrating elements of an evaluation circuit to facilitate the delay of a clock signal according to a corresponding embodiment.
Figure 6:
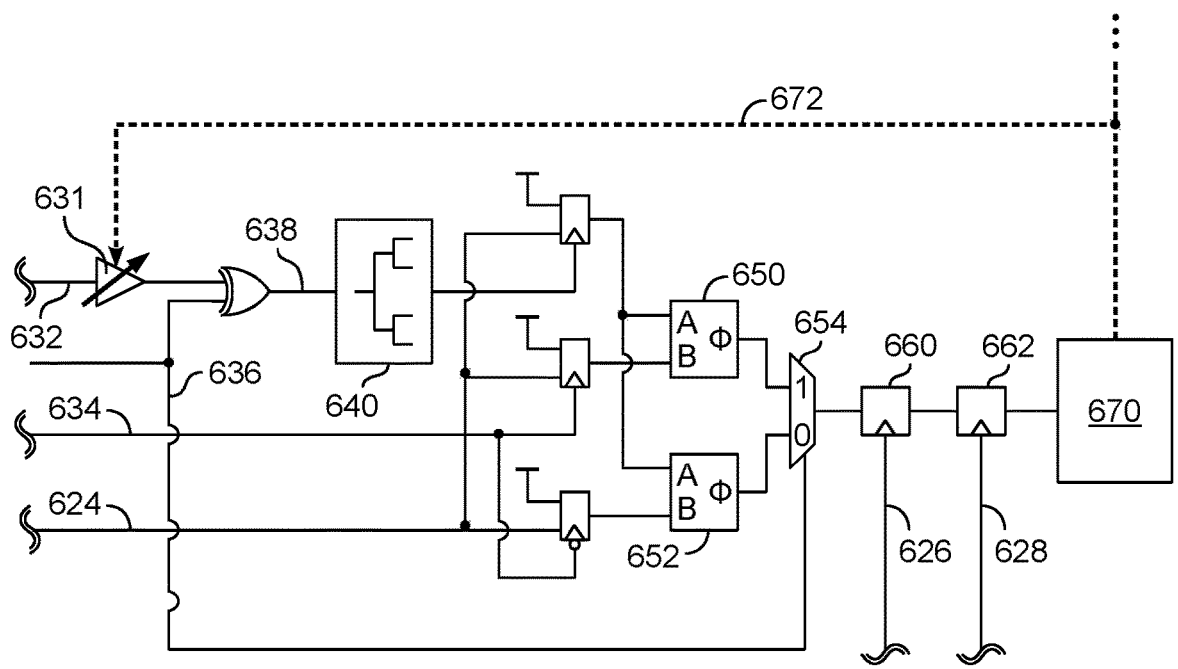

FIG. 6 shows features of an evaluator circuit 600 to participate in the generation of a delayed clock signal according to an embodiment. Evaluator circuit 600 is operable to provide delay locked loop circuit functionality such as that of evaluator circuit 180 and/or may provide an output such as the signal S1 which is generated at 250 of method 200.

As shown in FIG. 6, evaluator circuit 600 is coupled to receive a cyclical signal 604 (e.g., signal 162) and a control signal 602 which selectively enables a time delay detection functionality of evaluator circuit 600. With a counter 608 and other gate logic, a count signal 610 and a signal 628 are variously generated based on cyclical signal 604 and control signal 602. Count signal 610 represent a counter value Ctr which repeatedly cycles through a sequence that counts between some minimum count value and some maximum count value. Based on signal 610 and signal 628, logic gates variously output respective signals 620, 622, 624, 626, 634—e.g., wherein signal 620 is set to logic high based on Ctr being equal to one ("1") and signal 634 is set to high based on Ctr being equal to two ("2"). In such an embodiment, signal 620 represents the logical opposite state to that of signal 622, and a time difference between respective logic state transition of signals 620, 634 may correspond to an integer number of cycles of cyclical signal 604. In some embodiments, evaluator circuit 600 further comprises circuitry 612 to variously stabilize, filter or otherwise condition some or all of signals 620, 622, 634.

A differential amplifier 630 is coupled to generate a signal 632 which represents a difference between signals 620, 622. A delay line 631 may apply a delay to signal 632, where the delay is based on a feedback of a signal 672 which is also output from evaluator circuit 600. A control signal 636 selectively enables communication of a signal 638 (based on the delayed version of signal 632) through a model 640 of a clock signal distribution path. After communication through model 640, signal 638 is used—along with signals 634 and 624—to provide a latching of respective inputs to one or more phase detectors such as the illustrative phase detectors 650, 652 shown. To enable generation of signal 672 based on either one of a delay of a signal rise or a delay of a signal fall, phase detectors 650, 652 and a multiplexer 654 enable a selection—e.g., by control signal 636—between the use of signal rise transitions and signal fall transitions as a basis for detecting a time delay. In some embodiments, signal 636 both facilitates a selection of a type of signal edge (rising or falling) which is to be a basis for generating signal 672, and enables evaluator circuit 600 to lock to either a cycle or a phase of cyclical signal 604.

The output of multiplexer 654 is communicated to an encoder 670—e.g., where such communication is via latch circuits 660, 662 which are controlled by signals 626, 628 (respectively). Based on the output of multiplexer 654, encoder 670 may perform operations which identify an amount of a delay which is to be communicated to delay line 631 via the feedback of signal 672. For example, encoder 670 may identify a delay amount which will reduce a current time difference between the respective state transitions of inputs to one of phase detectors 650, 652. When the feedback by signal 672 is locked, a value of signal 672 indicates a time duration needed for communication via model 640 (and, correspondingly, a time duration for communication via a clock signal distribution path which model 640 represents). This value may be communicated by signal 672 to other circuitry (not shown) which is coupled to evaluator circuit 600, where said other circuitry—e.g., control circuitry 150—is to determine a delay to be applied to a clock signal.

Figure 7:
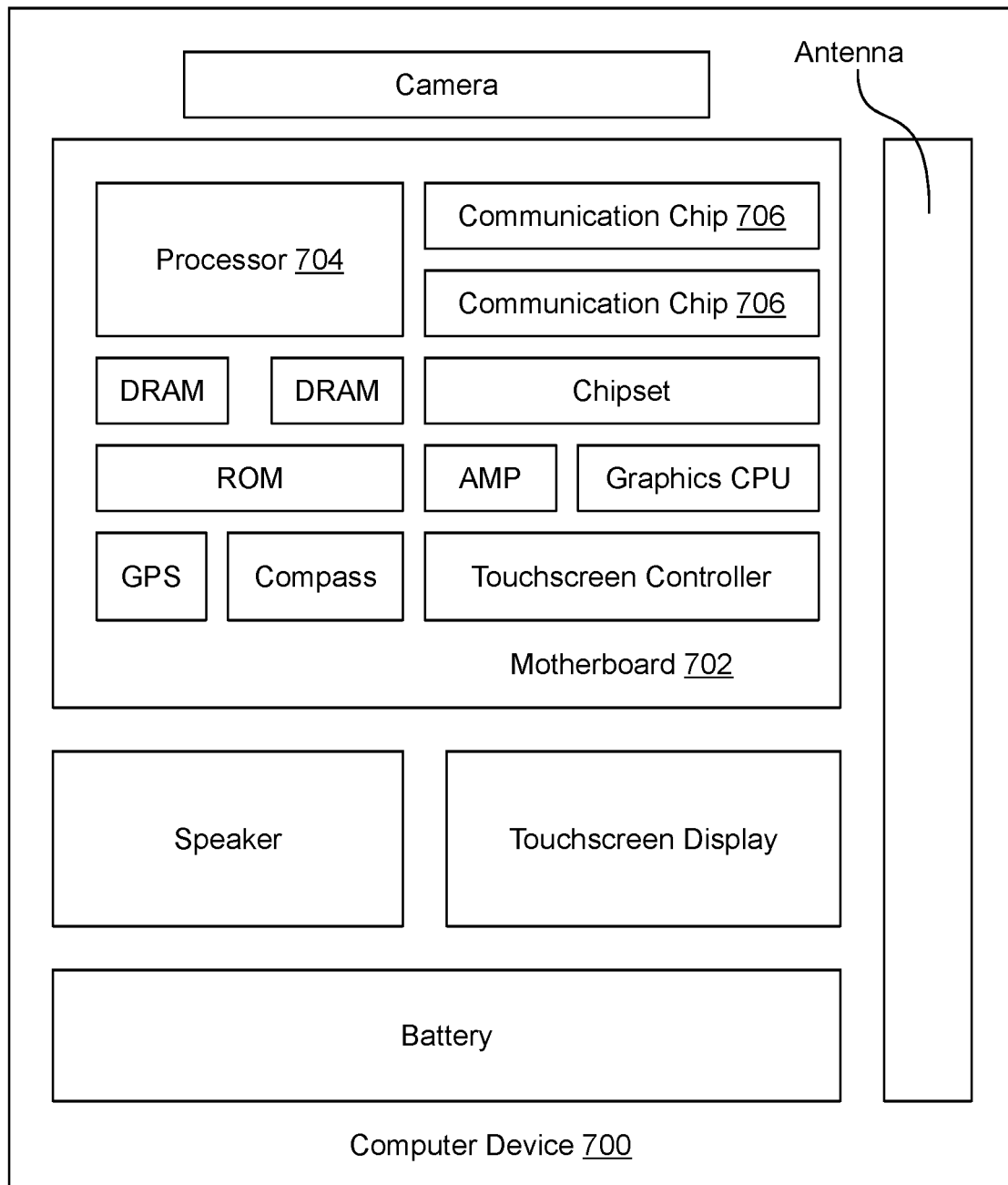
FIG. 7 illustrates a functional block diagram illustrating a computing device in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
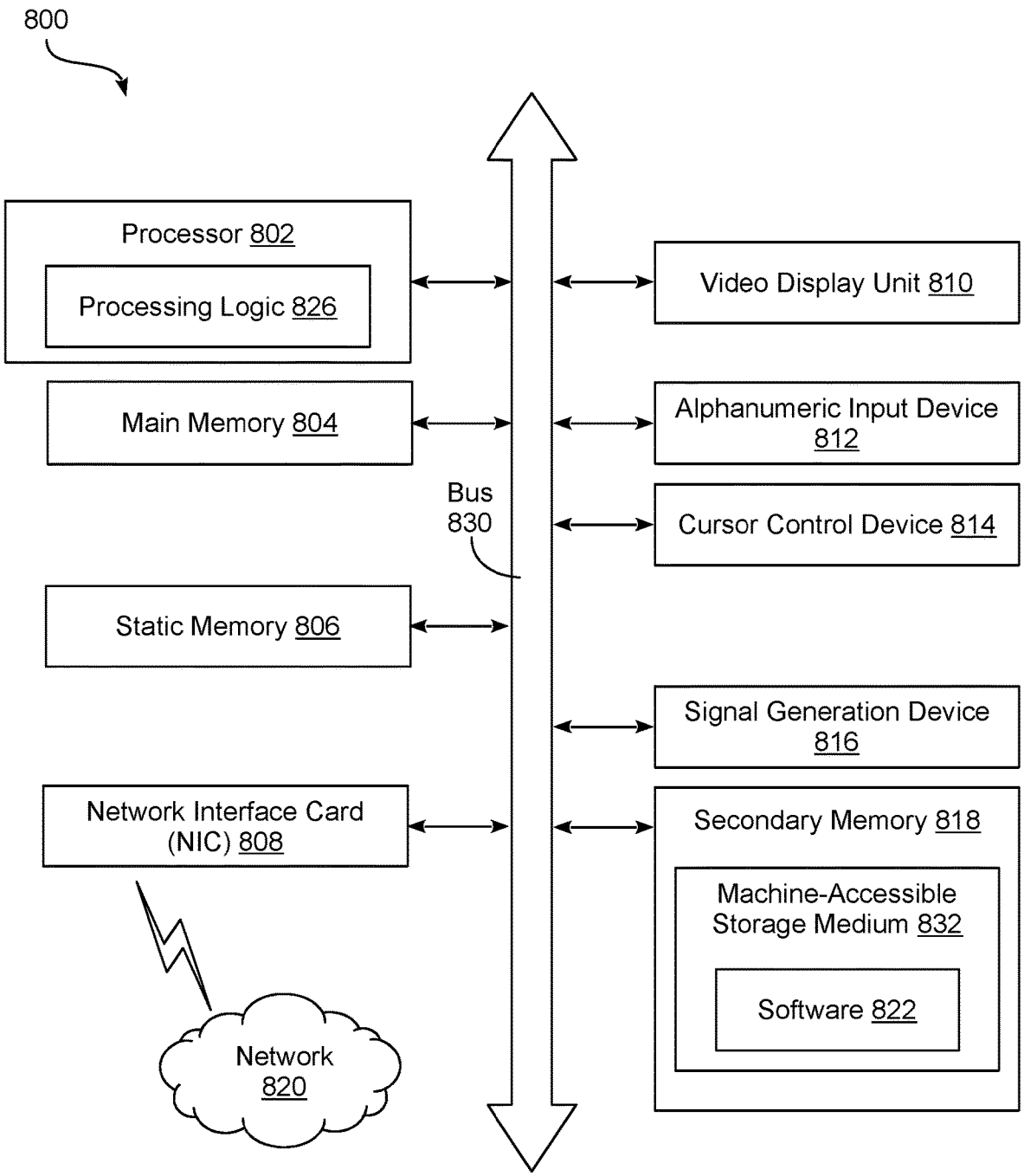
FIG. 8 illustrates a functional block diagram illustrating an exemplary computer system, in accordance with one embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, a method at an integrated circuit (IC) chip comprises receiving a first clock signal at first circuitry, generating a second clock signal with the first circuitry based on the first clock signal, receiving the second clock signal at second circuitry via a first signal path comprising a clock signal distribution path, and latching data of a data signal with the with second circuitry responsive to the second clock signal. The method further comprises generating a signal S1 with third circuitry, wherein a second signal path of the third circuitry comprises a model of the first signal path, wherein the signal S1 comprises a first indication of a first delay corresponding to the model, generating, based on a cyclical signal, a signal S2 comprising a second indication of a second delay based on a cycle of the cyclical signal, and providing the control signal to the first circuitry, wherein generating the second clock signal comprises the first circuitry applying the third delay to the first clock signal based on the control signal.

In an embodiment, the third delay is based on a sum of a first value and a second value, wherein the first value represents the first delay, and wherein the second value represents a time for a scalar multiple of one cycle of the cyclical signal. In another embodiment, the scalar multiple is one of one fourth or three fourths. In another embodiment, the scalar multiple is less than zero. In another embodiment, the scalar multiple is based on an evaluation of one of the first time duration or the second time duration. In another embodiment, the data signal is a first data signal, and the method further comprises receiving a second data signal at fourth circuitry, and at fifth circuitry, receiving each of the first clock signal, the signal S1 and the signal S2, and generating a third clock signal based on each of the first clock signal, the signal S1 and the signal S2, the generating comprising applying to the first clock signal a fourth delay other than the third delay, and with the fourth circuitry, latching data of the second data signal based on the third clock signal.

In another embodiment, the third delay is based on a first parameter specifying a time for a first scalar multiple of one cycle of the cyclical signal, wherein the fourth delay is based on a second parameter specifying a time for a second scalar multiple of one cycle of the cyclical signal, the second scalar multiple other than the first scalar multiple. In another embodiment, the first signal path further comprises the first circuitry. In another embodiment, the first circuitry comprises a programmable delay line. In another embodiment, generating the signal S2 comprises generating with a delay-locked loop circuit. In another embodiment, the method further comprises intermittently updating the control signal based on a change to one of the signal S1 or the signal S2. In another embodiment, the method further comprises detecting one of a temperature change or a voltage change at the IC chip, wherein intermittently updating the control signal is in response to the one of the temperature change or the voltage change. In another embodiment, the second signal path further comprises a model of an input-output (IO) receiver circuit or a model of an IO transmitter circuit. In another embodiment, the method further comprises receiving the data at a processor core from the second circuitry.

Techniques and architectures for determining a delay to a clock signal are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) chip comprising:
    first circuitry to receive a first clock signal, to generate a second clock signal based on the first clock signal, and to communicate the second clock signal via a first signal path which comprises a clock signal distribution path;
    second circuitry to generate a signal S1, wherein a second signal path of the second circuitry comprises a model of the first signal path, wherein the signal S1 comprises a first indication of a first delay corresponding to the model; and
    third circuitry to receive the signal S1 and a signal S2 comprising a second indication of a second delay based on a cycle of a cyclical signal, the third circuitry further to provide to the first circuitry a control signal based on the first indication and the second indication, wherein the first circuitry is to apply a third delay to the first clock signal based on the control signal, wherein the third delay is based on a sum of a first value and a second value, wherein the first value represents the first delay, and wherein the second value represents a time for a scalar multiple of one cycle of the cyclical signal.

2. The IC chip of claim 1, wherein the scalar multiple is based on an evaluation of one of the first time duration or the second time duration.

3. The IC chip of claim 1, further comprising:
    fourth circuitry to latch data of a data signal responsive to the second clock signal; and
    fifth circuitry to receive the first clock signal, the signal S1 and the signal S2, wherein the fifth circuitry is to generate a third clock signal based on each of the first clock signal, the signal S1 and the signal S2, and wherein the fifth circuitry is to apply to the first clock signal a fourth delay other than the third delay.

4. The IC chip of claim 1, wherein the first circuitry comprises a programmable delay line.

5. The IC chip of claim 1, wherein the third circuitry is to intermittently update the control signal based on a change to one of the signal S1 or the signal S2.

6. The IC chip of claim 5, wherein the third circuitry is to detect one of a temperature change or a voltage change at the IC chip, and wherein the third circuitry is to intermittently update the control signal responsive to the one of the temperature change or the voltage change.

7. An integrated circuit (IC) chip comprising:
    first circuitry to receive a data signal;
    second circuitry to receive a first clock signal and to generate a second clock signal based on the first clock signal, wherein the first circuitry is to receive the second clock signal via a first signal path comprising a clock signal distribution path, wherein the first circuitry is to latch data of the data signal responsive to the second clock signal;
    third circuitry to generate a signal S1, wherein a second signal path of the third circuitry comprises a model of the first signal path, wherein the signal S1 comprises a first indication of a first delay corresponding to the model;
    fourth circuitry to generate, based on a cyclical signal, a signal S2 comprising a second indication of a second delay based on a cycle of the cyclical signal; and
    fifth circuitry to receive the signal S1 and the signal S2, the fifth circuitry further to provide to the second circuitry a control signal based on the first indication and the second indication, wherein the second circuitry is to apply a third delay to the first clock signal based on the control signal, wherein the third delay is based on a sum of a first value and a second value, wherein the first value represents the first delay, and wherein the second value represents a time for a scalar multiple of one cycle of the cyclical signal.

8. The IC chip of claim 7, wherein the scalar multiple is based on an evaluation of one of the first time duration or the second time duration.

9. The IC chip of claim 7, wherein the data signal is a first data signal, the IC chip further comprising:
    sixth circuitry to receive a second data signal; and
    seventh circuitry to receive the first clock signal, the signal S1 and the signal S2, wherein the seventh circuitry is to generate a third clock signal based on each of the first clock signal, the signal S1 and the signal S2, wherein the seventh circuitry is to apply to the first clock signal a fourth delay other than the third delay, and wherein the sixth circuitry is to latch data of the second data signal based on the third clock signal.

10. The IC chip of claim 9, wherein the third delay is based on a first parameter specifying a time for a first scalar multiple of one cycle of the cyclical signal, wherein the fourth delay is based on a second parameter specifying a time for a second scalar multiple of one cycle of the cyclical signal, the second scalar multiple other than the first scalar multiple.

11. The IC chip of claim 7, wherein the first signal path further comprises the second circuitry.

12. The IC chip of claim 7, wherein the second circuitry comprises a programmable delay line.

13. The IC chip of claim 7, wherein the fourth circuitry comprises a delay-locked loop.

14. The IC chip of claim 7, wherein the second signal path further comprises a model of an input-output (IO) receiver circuit or a model of an IO transmitter circuit.

15. The IC chip of claim 7, further comprising a processor core to receive the data from the first circuitry.

16. A system comprising:
    an integrated circuit (IC) chip comprising:
        first circuitry to receive a data signal;
        second circuitry to receive a first clock signal and to generate a second clock signal based on the first clock signal, wherein the first circuitry is to receive the second clock signal via a first signal path comprising a clock signal distribution path, wherein the first circuitry to latch data of the data signal responsive to the second clock signal;
        third circuitry to generate a signal S1, wherein a second signal path of the third circuitry comprises a model of the first signal path, wherein the signal S1 comprises a first indication of a first delay corresponding to the model;
        fourth circuitry to generate, based on a cyclical signal, a signal S2 comprising a second indication of a second delay based on a cycle of the cyclical signal; and fifth circuitry to receive the signal S1 and the signal S2, the fifth circuitry further to provide to the second circuitry a control signal based on the first indication and the second indication, wherein the second circuitry to generate the second clock signal comprises the second circuitry to apply a third delay to the first clock signal based on the control signal, wherein the third delay is based on a sum of a first value and a second value, wherein the first value represents the first delay, and wherein the second value represents a time for a scalar multiple of one cycle of the cyclical signal; and a display device coupled to the IC chip, the display device to display an image based on the data signal.

17. The system of claim 16, wherein the data signal is a first data signal, the IC chip further comprising:

sixth circuitry to receive a second data signal; and seventh circuitry to receive the first clock signal, the signal S1 and the signal S2, the seventh circuitry to generate a third clock signal based on each of the first clock signal, the signal S1 and the signal S2, wherein the seventh circuitry is to apply to the first clock signal a fourth delay other than the third delay, and wherein the sixth circuitry is to latch data of the second data signal based on the third clock signal.

18. The system of claim 16, wherein the fifth circuitry is further to detect one of a temperature change or a voltage change at the IC chip, wherein the fifth circuitry is further to intermittently update the control signal responsive to the one of the temperature change or the voltage change.

* * * * *